United States Patent
Li et al.

(10) Patent No.: US 11,749,674 B2
(45) Date of Patent: Sep. 5, 2023

(54) ELECTROSTATIC DISCHARGE PROTECTION CIRCUIT

(71) Applicant: Changxin Memory Technologies, Inc., Anhui (CN)

(72) Inventors: Xin Li, Hefei (CN); Zhan Ying, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 39 days.

(21) Appl. No.: 17/568,915

(22) Filed: Jan. 5, 2022

(65) Prior Publication Data

US 2022/0320076 A1    Oct. 6, 2022

Related U.S. Application Data

(63) Continuation of application No. PCT/CN2021/113126, filed on Aug. 17, 2021.

(30) Foreign Application Priority Data

Apr. 1, 2021    (CN) .......................... 202110356382.1

(51) Int. Cl.
*H01L 27/02*    (2006.01)
*H02H 9/04*    (2006.01)
*H02H 1/00*    (2006.01)

(52) U.S. Cl.
CPC ......... *H01L 27/0292* (2013.01); *H02H 9/045* (2013.01); *H01L 27/0266* (2013.01); *H01L 27/0288* (2013.01); *H02H 1/0007* (2013.01)

(58) Field of Classification Search
CPC ...... H02H 9/046; H02H 9/045; H02H 1/0007; H01L 27/0285; H01L 27/0292; H01L 27/0288; H01L 27/0266

(Continued)

(56) References Cited

U.S. PATENT DOCUMENTS 6,849,902 B1 *  2/2005  Lin .................... H01L 27/0266
                                              257/365
8,867,183 B2 * 10/2014  Chen .................... H02H 9/046
                                              361/56

(Continued)

FOREIGN PATENT DOCUMENTS

CN    108880212 A  * 11/2018  ......... H01L 27/0285
JP    2014241537 A * 12/2014  ............ H02H 9/041

OTHER PUBLICATIONS

Machine Translation of Li etal Chinese Patent Document CN 108880212 A Nov. 23, 2018 (Year: 2018).*

(Continued)

*Primary Examiner* — Kevin J Comber
(74) *Attorney, Agent, or Firm* — Sheppard Mullin Richter & Hampton LLP (57) ABSTRACT

An electrostatic discharge (ESD) protection circuit including a monitoring unit, a main discharge transistor, and an auxiliary discharge transistor is provided herein. The monitoring unit is configured to detect an electrostatic pulse caused by accumulation of electrostatic charges. The main discharge transistor and the auxiliary discharge transistor are configured discharge the electrostatic charges to ground end after the electrostatic pulse is detected. A first section of a power supply metal line is coupled to the main discharge transistor and the auxiliary discharge transistor, a third section of the power supply metal line is coupled to an internal circuit protected by the ESD protection circuit, and a second section of the power supply metal line couples the first section to the third section. The power supply metal line includes an angle that is less than 180 degrees at a contact position between the second section and the first section.

16 Claims, 5 Drawing Sheets

(58) Field of Classification Search
USPC .......................................................... 361/56
See application file for complete search history.

(56) References Cited

U.S. PATENT DOCUMENTS

2004/0109270 A1* 6/2004 Stockinger .......... H01L 27/0251
361/56
2020/0136066 A1* 4/2020 Jin ......................... H10K 59/40

OTHER PUBLICATIONS

Machine Translation of Kato Japanese Patent Document JP 2014-241537 A Dec. 25, 2014 (Year: 2014).*

* cited by examiner

ELECTROSTATIC DISCHARGE PROTECTION CIRCUIT

CROSS REFERENCE TO RELATED APPLICATIONS

This application is a continuation application of International Patent Application No.: PCT/CN2021/113126, filed on Aug. 17, 2021, which claims priority to Chinese Patent Application No.: 202110356382.1 filed with the Patent Office of China on Apr. 1, 2021, titled "ELECTROSTATIC PROTECTION CIRCUIT", the entirety of which are incorporated herein by its reference.

TECHNICAL FIELD

This application relates to, but is not limited to, an electrostatic discharge protection circuit.

BACKGROUND

Static electricity is everywhere. Absent an electrostatic discharge protection circuit to protect a semiconductor chip, the semiconductor chip may be damaged by static electricity introduced to the semiconductor chip, thereby potentially causing the semiconductor chip to be non-functional.

Therefore, a semiconductor chip is usually provided with an electrostatic discharge protection circuit, which is configured to discharge electrostatic electricity to avoid catastrophic failures to the semiconductor chip.

SUMMARY

Embodiments of this application provide an electrostatic discharge protection circuit disposed between a power supply end and a grounding end of a chip, where an internal circuit connects the power supply end to the grounding end, and a power supply metal line connects the power supply end to the internal circuit. The electrostatic discharge protection circuit includes a monitoring unit configured to detect an electrostatic pulse on the power supply end, a main discharge transistor, and an auxiliary discharge transistor, both configured to be conductive after the electrostatic pulse is detected. The main discharge transistor and the auxiliary discharge transistor discharges electrostatic charges from the power supply end to the grounding end. The conduction time of the main discharge transistor is prior to the conduction time of the auxiliary discharge transistor. A first section of the power supply metal line is connected or coupled to a first end of the main discharge transistor and a first end of the auxiliary discharge transistor, a third section of the power supply metal line is connected or coupled to a first end of the internal circuit, and a second section of the power supply metal line connects the first section of the power supply metal line and the third section of the power supply metal line. The power supply metal line includes an angle that is less than 180 degrees at a contact position between the second section of the power supply metal line and the first section of the power supply metal line.

BRIEF DESCRIPTION OF THE ACCOMPANYING DRAWINGS

The accompanying drawings are incorporated in and constitute a part of the specification, illustrate embodiments consistent with this application, and together with the description serve to explain the principles of this application.

Specific embodiments of this application have been explicitly shown by the above accompanying drawings and will be described in more detail later. These accompanying drawings and literal descriptions are not intended in any way to limit the scope of the concept of this application but to illustrate the concept of this application for those skilled in the art by reference to specific embodiments.

DETAILED DESCRIPTION OF THE EMBODIMENTS

Exemplary embodiments, examples of which are shown in the accompanying drawings, will be explained in detail herein. When descriptions relate to the accompanying drawings, same numerals in different accompanying drawings denote same or similar elements unless otherwise indicated. Implementations described in the following exemplary embodiments are not representative of all implementations consistent with this application. Instead, they are only examples of devices and methods consistent with some aspects of this application as detailed in the appended claims.

Static electricity is everywhere. Absent an electrostatic discharge (ESD) protection circuit to protect a chip (e.g., a semiconductor device), the chip may be damaged by static electricity introduced to the chip, thereby causing the chip to be non-functional. For example, when a person touches a pin of a chip, voltage at the pin can reach several hundreds or even thousands of volts, which can cause an electrostatic discharge and potentially damage the chip. As another example, when a device (e.g., a semiconductor fabrication robotic arm) touches a pin of a chip, voltage at the pin touched by the device can reach several hundred volts, which can cause electrostatic discharges and potentially damage the chip.

To ensure safety of chips, each chip includes an electrostatic discharge protection circuit. In general, types of electrostatic discharge protection circuits can vary according to functions of pins for which the electrostatic discharge protection circuits are designed to protect. For example, electrostatic discharge protection circuits to protect power supply pins of chips can be different from electrostatic discharge protection circuits to protect I/O pins of chips.

Figure 1:
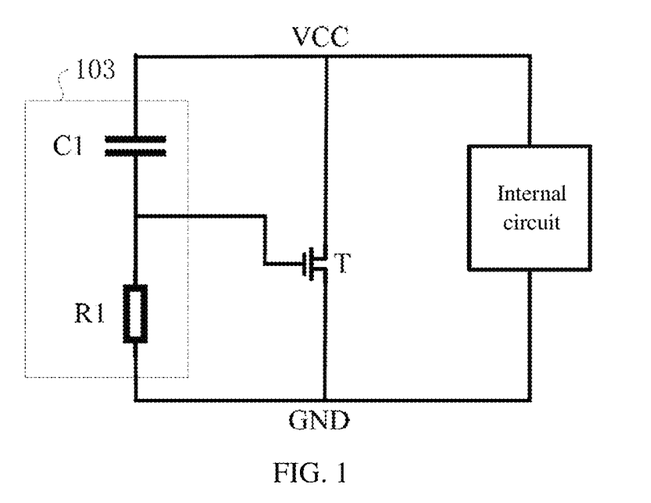
FIG. 1 illustrates a schematic diagram of an electrostatic discharge protection circuit of an internal circuit, according to an embodiment of this application.

FIG. 1 illustrates a schematic diagram of an electrostatic discharge protection circuit of an internal circuit, according to an embodiment of this application. As shown in FIG. 1, the electrostatic discharge protection circuit is disposed between a power supply end (VCC) and a grounding end (GND). The electrostatic discharge protection circuit includes a monitoring unit 103 and a discharge transistor T. The monitoring unit 103 includes a monitoring capacitor C1 and a monitoring resistor R1. The monitoring capacitor C1 is connected or coupled to the monitoring capacitor R1 in series. One end of the monitoring unit 103 is connected or coupled to the power supply end and the other end of the monitoring unit 103 is connected or coupled to the grounding end.

In general, peak current of an electrostatic discharge can reach 1.5 A. Handling such large current requires a size of the discharge transistor T to be large. As a general rule, the larger the transistor, the larger the driving current needed to turn ON the transistor. As such, when an electrostatic pulse is detected at the power supply end, the discharge transistor T may be at risk of not being able to discharge electrostatic charges accumulated on the power supply end in time, thereby subjecting the internal circuit protected by the electrostatic discharge protection circuit to risk of being damaged by the electrostatic discharge.

Figure 2:
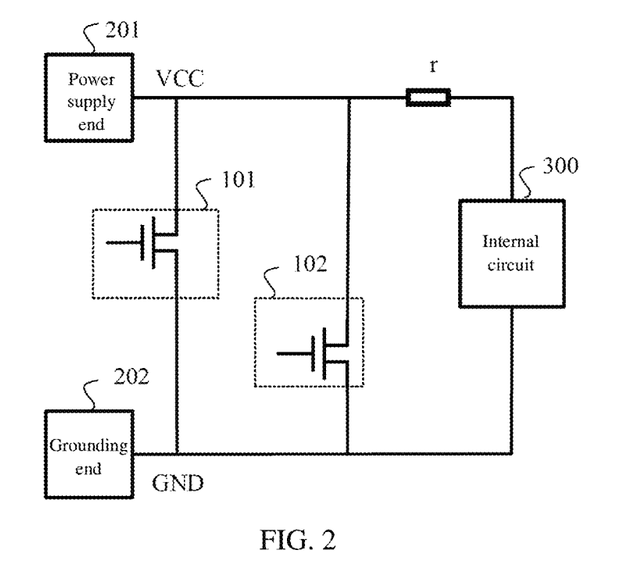
FIG. 2 illustrates a circuit diagram of an electrostatic discharge protection circuit of an internal circuit, according to an embodiment of this application.
Figure 3:
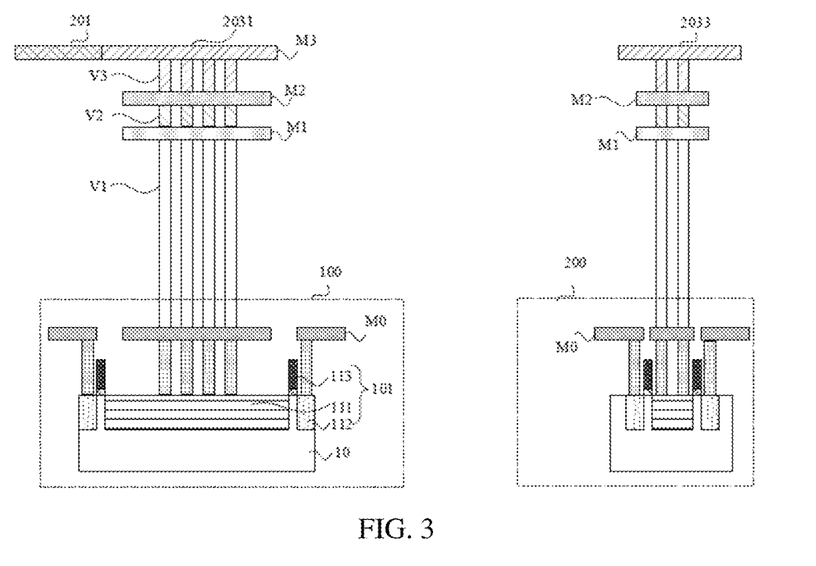
FIG. 3 illustrates a cross-sectional view of a circuit structure of an electrostatic discharge protection circuit of an internal circuit, according to an embodiment of this application.

FIG. 2 illustrates a circuit diagram of an electrostatic discharge protection circuit of an internal circuit 300, according to an embodiment of this application. FIG. 3 illustrates a cross-sectional view of a circuit structure of the electrostatic discharge protection circuit of FIG. 2, according to an embodiment of this application. As shown in FIG. 2, the electrostatic discharge protection circuit is disposed between a power supply end 201 and a grounding end 202 of a chip. The internal circuit 300 is disposed between the power supply end 201 and the grounding end 202. The electrostatic discharge protection circuit is configured to protect the internal circuit 300.

Now referring to FIG. 3, the electrostatic discharge protection circuit includes a first metal layer M3, a second metal layer M2, a third metal layer M1, and a fourth metal layer M0. The first metal layer M3, the second metal layer M2, the third metal layer M1, and the fourth metal layer M0 are arranged in an order (e.g., a vertical order) from a top to a bottom of a substrate 10. As shown in FIG. 3, the first layer M3 is connected or coupled to the second metal layer M2 through a plurality of through holes V3 (e.g., vias). The second metal layer M2 is connected or coupled to the third metal layer M1 through a plurality of through holes V2 (e.g., vias). The third metal layer M1 is connected or coupled to the fourth metal layer M0 through a plurality of through holes V1 (e.g., vias).

Referring back to FIG. 2, a metal wire connected or coupled to the power supply end 201 is referred to as a power supply metal line. The power supply metal line can be coupled to one or more of the first metal layer M3, the second metal layer M2, the third metal layer M1, and the fourth metal layer M0. Referring to FIG. 3 and FIGS. 4a-4c, the power supply metal line includes a first section 2031, a second section 2032 (not shown in FIG. 3; see FIG. 4c; FIG. 4c may be understood as showing a cross-section of the power supply metal line), and a third section 2033. The first section 2031 of the power supply metal line is connected or coupled to the power supply end 201, the second section 2032 of the power supply metal line is disposed between the first section 2031 and the third section 2033 of the power supply metal line, and the third section 2033 of the power supply metal line is connected or coupled to a first end of the internal circuit 300. A second end of the internal circuit 300 is connected or coupled to the grounding end 202. In FIG. 3, the electrostatic discharge protection circuit of FIG. 2 is represented by a first circuit structure 100 and the internal circuit 300 of FIG. 2 is represented by a second circuit structure 200. In general, the first circuit structure 100 is disposed in vicinity of the power supply end 201, while the second circuit structure 200 is disposed far away from the power supply end 201.

Figure 4A:
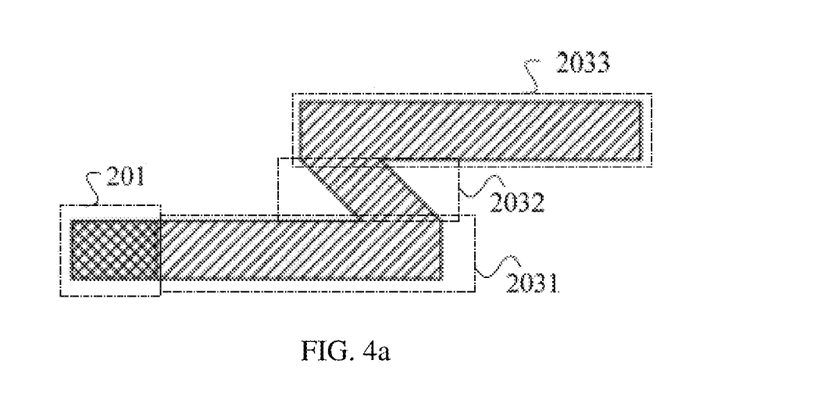
FIGS. 4a-4c illustrate schematic wiring diagrams of a power supply metal line, according to an embodiment of this application.
Figure 4B:
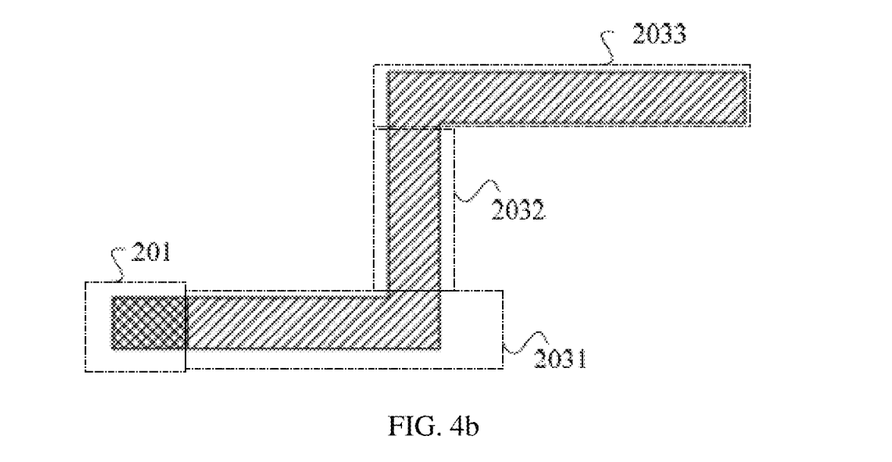
Figure 4C:
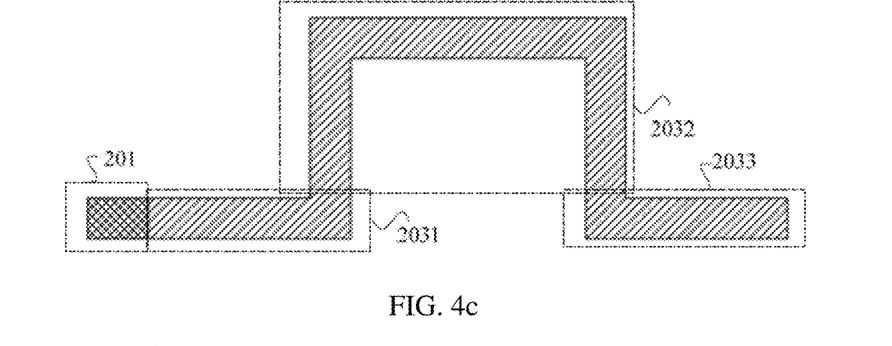

FIGS. 4a-4c illustrate schematic wiring diagrams of a power supply metal line, according to an embodiment of this application. In some embodiments, the power supply metal line of FIGS. 2-3 can be implemented using the power supply metal line of FIGS. 4a-4c. Referring to FIGS. 4a-4c, in some embodiments, the power supply metal line includes a first angle that is less than 180 degrees at a first contact position between the second section 2032 of the power supply metal line and the first section 2031 of the power supply metal line. That is, the power supply metal line between the first end of the internal circuit 300 and the power supply end 201 is not a straight line. In some embodiments, the power supply metal line further includes a second angle that is less than 180 degrees at a second contact position between the second section 2032 of the power supply metal line and the third section 2033 of the power supply metal line. That is, the power supply metal line between the first end of the internal circuit 300 and the power supply end 201 is not a straight line. From the perspective of a signal flow, there is impedance discontinuity at the first contact position from the first section 2031 to the second section 2032 and the second contact position from the second section 2032 to the third section 2033. In general, an electrostatic pulse caused by electrostatic electricity may be regarded as a high frequency signal. For example, rise time of an electrostatic pulse caused by electrostatic electricity can be few nanoseconds. When an electrostatic pulse is regarded as a high frequency signal, signal reflection can exist at locations where impedance discontinuity is present. For example, when a high frequency signal is transmitted from the power supply end 201 through the first section 2031 of the power supply metal line to the second section 2032 of the power supply metal line, a portion of energy of the high frequency signal may be lost at the first contact position between the first section 2031 and the second section 2032. In this example, because of impedance discontinuity at the first contact position, signal reflection may occur. For instance, 90% of the high frequency signal may be transmitted from the first section 2031 to the second section 2032, while 10% of the high frequency signal may be lost at the first contact position where signal reflection occurs. The electrostatic pulse is transmitted from the power supply end 201 to the first end of the internal circuit 300. Loss of energy may depend on many aspects such as a frequency of an electrostatic pulse and/or a magnitude of impedance discontinuity in a transmission path of the electrostatic pulse. The technical solution of FIGS. 4a-4c should be understood as three distinct embodiments and do not constitute a limitation of the inventive concept of this application for special treatment of the power supply metal line between the power supply end 201 and the internal circuit 300.

Referring back to FIG. 2 and FIG. 3, the electrostatic discharge protection circuit includes a main discharge transistor 101, an auxiliary discharge transistor 102, and a monitoring unit (not shown in FIG. 2). The main discharge transistor 101 is provided with a control end 113, a first end 111, and a second end 112. The auxiliary discharge transistor 102 is also provided with a control end, a first end, and a second end. The first end 111 of the main discharge transistor 101 is connected or coupled to the first section 2031 of the power supply metal line and the second end 112 of the main discharge transistor 101 is connected or coupled to the grounding end 202. The first end of the auxiliary discharge transistor 102 is connected or coupled to the first section 2031 of the power supply metal line and the second end of the auxiliary discharge transistor 102 is connected or coupled to the grounding end 202.

The monitoring unit is configured to detect an electrostatic pulse caused by electrostatic charges on the power supply end 201. The main discharge transistor 101 is configured to become conductive upon detection of the electrostatic pulse. In this way, the electrostatic charges are discharged from the power supply end 201 to the grounding end 202 through the first section 2031 of the power supply metal line and the main discharge transistor 101. The auxiliary discharge transistor 102 is also configured to become conductive upon detection of the electrostatic pulse on the power supply end 201. In this way, the electrostatic charges are further discharged from the power supply end 201 to the grounding end 202 through the first section 2031 of the power supply metal line and the auxiliary discharge transistor 102.

The conduction time of the main discharge transistor 101 is prior to the conduction time of the auxiliary discharge transistor 102. That is, after the electrostatic pulse is detected, the main discharge transistor 101 becomes conductive first, to discharge the electrostatic charges accumulated on the power supply end 201 to the grounding end 202. The auxiliary discharge transistor 102 becomes conductive, shortly thereafter, to further discharge the electrostatic charges. The main discharge transistor 101 and the auxiliary discharge transistor 102 both become conductive to discharge the electrostatic charges from the power supply end 201 to the grounding end 202 together. After a period of time, the main discharge transistor 101 is turned off and, therefore, no longer discharges the electrostatic charges. At this time, the auxiliary discharge transistor 102 remains conductive and can continue to discharge remaining electrostatic charges to the grounding end 202. In other words, the disconnection time of the main discharge transistor 101 is also prior to the disconnection time of the auxiliary discharge transistor 102.

When an electrostatic pulse is detected, the main discharge transistor 101 becomes conductive and discharges electrostatic charges accumulated on the power supply end 201. Because of impedance discontinuity between the first section 2031 and the second section 2032 of the power supply metal line, a portion of the electrostatic pulse may be reflected. This reflection weakens strength of discharging current transmitted to the internal circuit 300 through the power supply metal line. As such, combination of the main discharge transistor 101 discharging the electrostatic charges to the grounding end 202 and the reflection of the electrostatic pulse due to impedance discontinuity can greatly reduce the accumulation of electrostatic charges at the power supply end 201. In this way, voltage at the power supply end 201 does not rise excessively fast, thereby effectively preventing potential damage to the internal circuit 300.

The auxiliary discharge transistor 102 becomes conductive, shortly after the main discharge transistor 101 becoming conductive. The main discharge transistor 101 and the auxiliary discharge transistor 102 both become conductive to discharge electrostatic charges accumulated on the power supply end 201. At this time, impedance discontinuity may continuously reflect the electrostatic pulse. After a period of time, the main discharge transistor 101 is turned off, while the auxiliary discharge transistor 102 remains conductive and continues to discharge remaining electrostatic charges, thereby prolonging discharge time and improving electrostatic discharge capability of the electrostatic discharge protection circuit.

Referring to FIG. 3, in an embodiment, the power supply metal line is disposed in the first metal layer M3, which is beneficial to wiring (e.g., wiring layout on a semiconductor substrate) the power supply metal line to increase impedance discontinuity. In some cases, changing wiring mode of the power supply metal line can further enhance reflection of a high frequency pulse signal (e.g., an electrostatic pulse) due to impedance discontinuity.

In an embodiment, as shown in FIGS. 4b-4c, the angle at the first contact position between the second section 2032 of the power supply metal line and the first section 2031 of the power supply metal line is a right angle or an acute angle. By this arrangement, a degree of impedance discontinuity at the second section 2032 and the third section 2033 of the power supply metal line can be increased, thereby improving a reflection capability of impedance discontinuity to high frequency pulse signals and weakening damage of electrostatic pulses to the internal circuit 300.

In an embodiment, as shown in FIG. 4a, the angle at the first contact position between the second section 2032 of the power supply metal line and the first section 2031 of the power supply metal line is less than 180 degrees, and the angle at the second contact position between the second section 2032 of the power supply metal line and the third section 2033 of the power supply metal line is less than 180 degrees. By this arrangement, a degrees of impedance discontinuity at the second section 2032 and the third section 2033 of the power supply metal line can be further increased, thereby further improving reflection capability of impedance discontinuity to high frequency pulse signals and further weakening damage of electrostatic pulses to the internal circuit 300.

When the power supply metal line is laid out on the first metal layer M3, usually the power supply metal line is wired in a straight line mode. By enabling the power supply metal line to include an angle less than 180 degrees at the first contact position between the second section 2032 of the power supply metal line and the first section 2031 of the power supply metal line, impedance discontinuity at the second section 2032 and the third section 2033 of the power supply metal line can be increased, and the impedance discontinuity can reflect portions of high-frequency pulse signals (e.g., electrostatic pulses), thus effectively preventing damage caused by electrostatic pulses to the internal circuit 300. Moreover, a layout of the power supply metal line has a slight influence on wiring and parasitic resistance, and does not affect normal power-on of the internal circuit 300.

In the above-mentioned technical solution, the main discharge transistor 101 becomes conductive before the auxiliary discharge transistor 102. Electrostatic charges can be discharged through the main discharge transistor 101 when an electrostatic pulse is detected. Impedance discontinuity between the first section 2031 of the power supply metal line and the internal circuit 300 may further reflect portion of the electrostatic pulse. In this way, voltage at the power supply end 201 does not rise excessively fast caused by accumulation of the electrostatic charges, thereby protecting the internal circuit 300. In addition, when the main discharge transistor 101 is turned off, the auxiliary discharge transistor 102 remains conductive and can continuous to discharge remaining electrostatic charges, thereby prolonging discharge time and improving discharge capability of the electrostatic discharge protection circuit.

Figure 5:
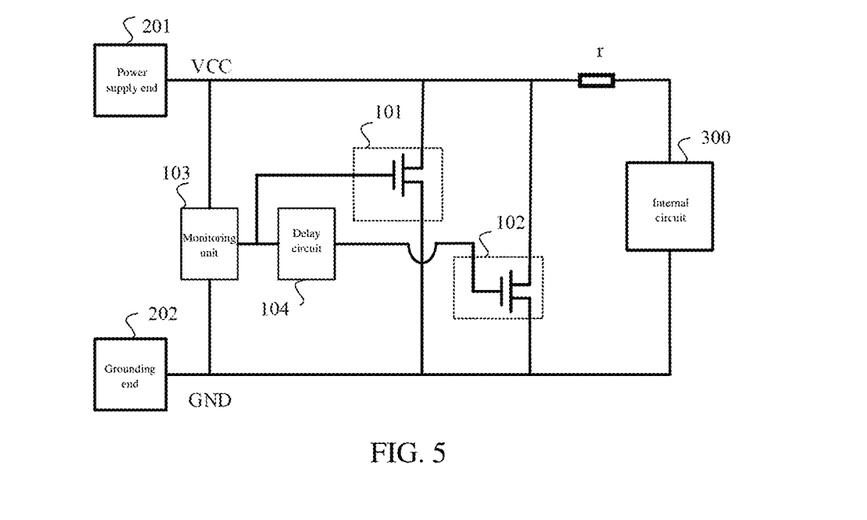
FIG. 5 illustrates a circuit diagram of an electrostatic discharge protection circuit of an internal circuit, according to an embodiment of this application.

FIG. 5 illustrates a circuit diagram of an electrostatic discharge protection circuit of an internal circuit 300, according to an embodiment of this application. The electrostatic discharge protection circuit of FIG. 5 is similar to the electrostatic discharge protection circuit of FIG. 2. As shown in FIG. 5, the electrostatic discharge protection circuit is disposed between a power supply end 201 and a grounding end 202. A power supply metal line disposed at the power supply end 201 includes a first section 2031, a second section 2032, and a third section 2033. Wiring mode of the power supply metal line has been described in detail in the foregoing embodiments and will not be repeated herein. Due to designs of wiring of the power supply metal line, impedance discontinuity of the power supply metal line can be represented by a resistor r in FIG. 5. Please note, resistors r shown in FIG. 2 and FIGS. 6-9 are also illustrative of the impedance discontinuity. In general, the resistor r is a physical metal line in a semiconductor chip. The resistor r includes a resistance value and an inductance value. The resistance value and the inductance value can be determined according to length, width, and conductivity of the power supply metal line. While the resistor r is used in this application to represent impedance discontinuity, there will be some additional influence to electrostatic pulses due to the resistance value and inductance value inherent of the resistor r. For example, parasitic inductance increases as impedance discontinuity increases. As another example, a large parasitic inductance can store more energy of electrostatic pulses, which can be beneficial to reduce damage caused by the electrostatic pulses to the internal circuit 300.

The electrostatic discharge protection circuit includes a main discharge transistor 101, an auxiliary discharge transistor 102, a monitoring unit 103, and a delay circuit 104. The monitoring unit 103 is provided with an output end, and the main discharge transistor 101 is provided with a control end, a first end, and a second end. The output end of the monitoring unit 103 is connected or coupled to the control end of the main discharge transistor 101. The first end of the main discharge transistor 101 is connected or coupled to the first section 2031 of the power supply metal line and the second end of the main discharge transistor 101 is connected or coupled to the grounding end 202.

The delay circuit 104 is provided with an input end and an output end. The auxiliary discharge transistor 102 is provided with a control end, a first end, and a second end. The control end of the main discharge transistor 101 is connected or coupled to the input end of the delay circuit 104, and the output end of the delay circuit 104 is connected or coupled to the control end of the auxiliary discharge transistor 102. The first end of the auxiliary discharge transistor 102 is connected or coupled to the first section 2031 of the power supply metal line and the second end of the auxiliary discharge transistor 102 is connected or coupled to the grounding end 202.

The monitoring unit 103 is configured to detect an electrostatic pulse caused by accumulation of electrostatic charges on the power supply end 201 and output a first control signal when the electrostatic pulse is detected. The first control signal causes the main discharge transistor 101 to become conductive and discharges the electrostatic charges from the powers supply end 201 to the grounding end 202. The delay circuit 104 is configured to delay the first control signal outputted by the monitoring unit 103 and convert the first control signal into a second control signal that causes the auxiliary discharge transistor 102 to become conductive. In this way, the auxiliary discharge transistor 102 is configured to be conductive after some time delay after the main discharge transistor 101 becomes conductive and discharges the electrostatic charges together with the main discharge transistor 101. After the electrostatic charges are discharged for a period of time, the first control signal at the output end of the monitoring unit 103 is switched causing the main discharge transistor 101 to turn off and stop discharging the electrostatic charges. At this time, the second control signal outputted by the delay circuit 104 is delayed for a period of time before the second control signal is switched. This allows the auxiliary discharge transistor 102 to remain conductive and continue to discharge remaining electrostatic charges from the power supply end 201 to the grounding end 201. After the second control signal outputted by the delay circuit 104 is switched, the auxiliary discharge transistor 102 is turned off. Delay time of the delay circuit 104 may be set according to actual process conditions. For example, the delay time of the delay circuit 104 can be set to picoseconds or nanoseconds.

In an embodiment, a size of the main discharge transistor 101 is greater than a size of the auxiliary discharge transistor 102. That is, the main discharge transistor 101 has a discharge capacity higher than a discharge capacity of the auxiliary discharge transistor 102. As such, the main discharge transistor 101 discharges a larger portion of electrostatic charges. When an electrostatic pulse is detected, the monitoring unit 103 causes the main discharge transistor 101 to become conductive and the main discharge transistor 101 discharges electrostatic charges accumulated on the power supply end 210 to the grounding end 202 at a relatively large discharge current. Impedance discontinuity at the first section 2031 and the second section 2032 of the power supply metal line may also reflect part of the electrostatic pulse. This reflection weakens strength of discharging current to the internal circuit 300 through the power supply metal line. As such, combination of the main discharge transistor 101 discharging the electrostatic charges to the grounding end 202 and the reflection of the electrostatic pulse due to impedance discontinuity can greatly reduce accumulation of electrostatic charges at the power supply end 201. In this way, electrostatic discharge capability of the electrostatic discharge protection circuit 100 is improved, thereby protecting the internal circuit 300 from electrostatic damage.

Figure 6:
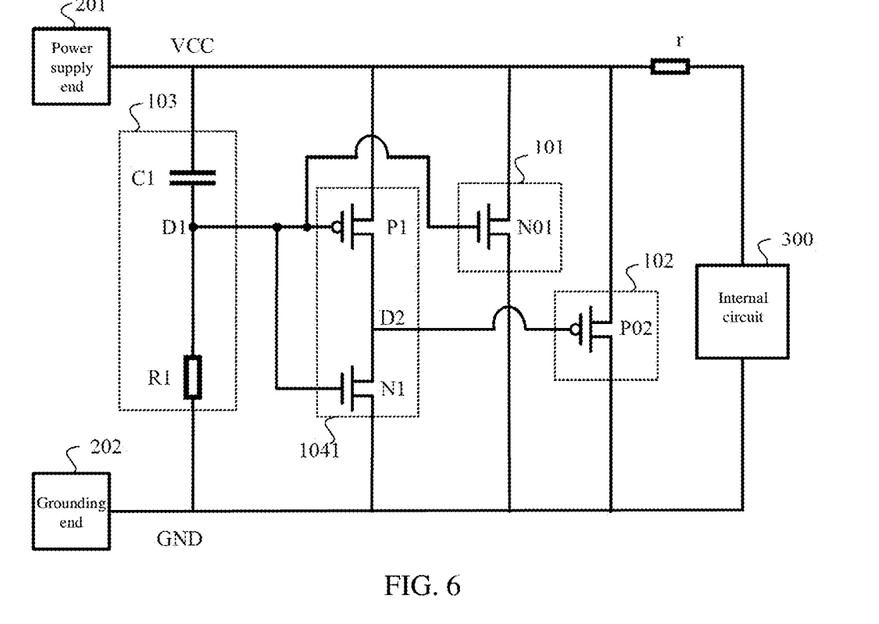
FIG. 6 illustrates a circuit diagram of an electrostatic discharge protection circuit of an internal circuit, according to an embodiment of this application.

FIG. 6 illustrates a circuit diagram of an electrostatic discharge protection circuit of an internal circuit 300, according to an embodiment of this application. The schematic shown in FIG. 6 is same as the schematic shown in FIG. 5. The only difference is that circuitries of the monitoring unit 103 and the delay circuit 104 are shown in detail. Referring to FIG. 6, in an embodiment, the main discharge transistor 101 is an N-type transistor and the auxiliary discharge transistor 102 is a P-type transistor. The monitoring unit 103 includes a monitoring capacitor C1 and a monitoring resistor R1 arranged in series. The monitoring capacitor C1 is provided with a first end and a second end.

The monitoring resistor R1 is provided with a first end and a second end. The first end of the monitoring capacitor C1 is connected or coupled to the first section 2031 of the power supply metal line and the second end of the monitoring resistor R1 is connected or coupled to the grounding end 202. The first end of the monitoring resistor R1 is connected or coupled to the second end of the monitoring capacitor C1 and is the output end of the monitoring unit 103.

The delay circuit 104 includes a first inverter 1041. An input end of the first inverter 1041 is the input end of the delay circuit 104 and an output end of the first inverter 1041 is the output end of the delay circuit 104. The first inverter 1041 includes a first driving transistor P1 and a second driving transistor N1. The first driving transistor P1 is a P-type transistor and the second driving transistor N1 is an N-type transistor.

A source of the first driving transistor P1 is connected or coupled to the first section 2031 of the power supply metal line and a source of the second driving transistor N1 is connected or coupled to the grounding end 202. A drain of the first driving transistor P1 is connected or coupled to a drain of the second driving transistor N1 and is the output end of the first inverter 1041. A gate of the first driving transistor P1 is connected or coupled to a gate of the second driving transistor N1 and is the input end of the first inverter 1041.

A gate of the main discharge transistor 101 is connected or coupled to the second end of the monitoring capacitor C1 (e.g., node D1), the gate of the first driving transistor P1 and the gate of the second driving transistor N1 are connected or coupled to the second end of the monitoring capacitor C1, and the drain of the first driving transistor P1 and the drain of the second driving transistor N1 (e.g., node D2) are connected or coupled to a gate of the auxiliary discharge transistor 102.

Working principle of the electrostatic discharge protection circuit of FIG. 6 is described below with reference to FIG. 6:

When an electrostatic pulse is detected, for example, when voltage of the power supply end 201 rises from 0 V to 1 V in 1 ns (after Fourier decomposition, a fundamental frequency can be considered to be approximately 1 Ghz). Because an equivalent impedance of the monitoring capacitor C1 in response to a high frequency signal is $1/(2*\pi*f*C1)$, a smaller rise time indicates a higher signal frequency and a smaller equivalent impedance of the monitoring capacitor C1. At this time, voltage at node D1 is approximately VCC. Under this scenario, the main discharge transistor 101 becomes conductive. The second driving transistor N1 also becomes conductive. At this time, the electrostatic charges are discharged to the grounding end 202 through the first section 2031 of the power supply metal line and the main discharge transistor 101.

After the second driving transistor N1 becomes conductive, voltage at node D2 is pulled down to GND. That is, voltage at node D2 is not pulled down GND until after a delay in conduction time of the second driving transistor N1. The first inverter 1041 outputs a low-level signal, and the auxiliary discharge transistor 102 becomes conductive in response to the low-level signal. The electrostatic charges are further discharged to the grounding end 202 through the first section 2031 of the power supply metal line and the auxiliary discharge transistor 102.

When an electrostatic pulse is detected, impedance discontinuity at the first section 2031 and the second section 2032 of the power supply metal line may reflect part of the electrostatic pulse, thereby reducing strength of the electrostatic pulse transmitted to the internal circuit 300 through the power supply metal line.

Conduction of the main discharge transistor 101, conduction of the auxiliary discharge transistor 102, and reflection due to impedance discontinuity to an electrostatic pulse may slow down the continuous rise of voltage of the power supply end 201 to a certain extent, but because discharge speeds of the main discharge transistor 101 and the auxiliary discharge transistor 102 and an amount of reflection due to the impedance discontinuity to the electrostatic pulse signal are less than an accumulation speed of the electrostatic charges, voltage of the power supply end 201 may continue to rise.

When voltage of the power supply end 201 continues to rise, for example, when voltage of the power supply end 201 continues to rise from 1 V to 2 V, conduction capabilities or discharge speeds of the main discharge transistor 101 and the auxiliary discharge transistor 102 may become larger and larger, until the conduction capabilities or discharge speeds of the main discharge transistor 101 and the auxiliary discharge transistor 102 and an amount of reflection due to the impedance discontinuity to the electrostatic pulse are equal to an accumulation speed of the electrostatic charges. At this point, voltage of the power supply end 201 no longer continues to rise. For example, voltage of the power supply end 201 no longer rises beyond 2 V.

When voltage of the power supply end 201 rises slowly, or when voltage of the power supply end 201 no longer continues to rise, or when voltage of the power supply end 201 starts to drop. At this time, an equivalent impedance of the monitoring resistor R1 (usually tens of kilohms) and the monitoring capacitor C1 rises, charges (e.g., voltage) at the gate of the main discharge transistor 101 discharge through the monitoring resistor R1, and voltage at node D1 gradually decreases to GND causing the main discharge transistor 101 to turn off. However, at this time, electrostatic charges on the power supply end 201 have not been completely discharged (i.e., bled off). After voltage at node D1 drops from VCC to GND, voltage at node D2 may not be immediately pulled up from GND to VCC. As such, the auxiliary discharge transistor 102 may continue to discharge remaining electrostatic charges until voltage at node D2 is pulled up to VCC, at which point, the auxiliary discharge transistor 102 is turned off. In addition, after the main discharge transistor 101 is turned off, impedance discontinuity of the first section 2031 and the second section 2032 of the power supply metal line can still reflect part of the electrostatic pulse.

In the above-mentioned technical solution, the main discharge transistor 101 becomes conductive first when the electrostatic pulse arrives to discharge the electrostatic charges in time. The impedance discontinuity may further reflect part of the electrostatic pulse signal so that voltage at the power supply end 201 does not rise excessively fast caused by accumulation of the electrostatic charges, thereby protecting the internal circuit 300. However, when voltage at the power supply end 201 no longer rises, voltage at node D1 is switched from a high level to a low level, and the main discharge transistor 101 is turned off. There is delay of a start time of a P-type transistor for voltage at node D2 to be switched from a low level to a high level. In this way, the auxiliary discharge transistor 102 may continue to discharge remaining electrostatic charges, thereby prolonging discharge time and improving discharge capacity of the electrostatic discharge protection circuit.

Figure 7:
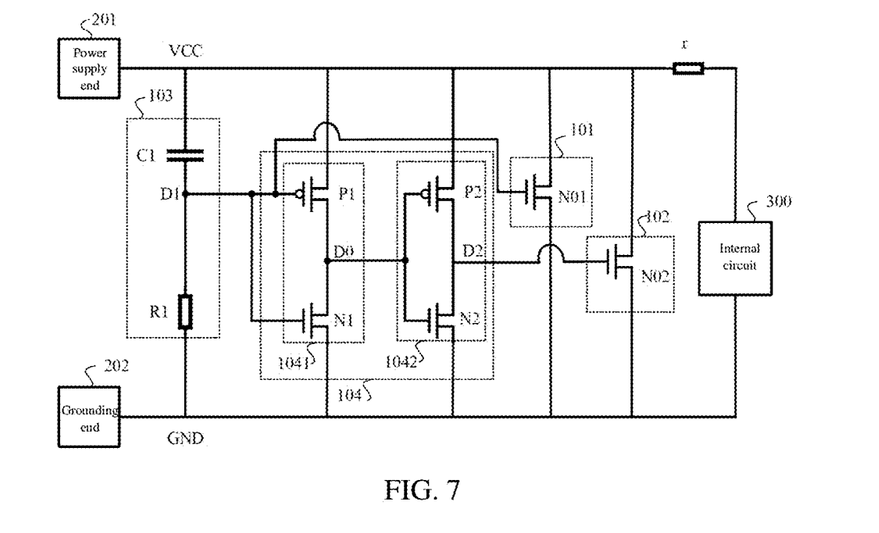
FIG. 7 illustrates a circuit diagram of an electrostatic discharge protection circuit of an internal circuit, according to an embodiment of this application.

FIG. 7 illustrates a circuit diagram of an electrostatic discharge protection circuit of an internal circuit 300, according to an embodiment of this application. The schematic shown in FIG. 7 is similar to the schematic shown in FIG. 6. As shown in FIG. 7, the main discharge transistor 101 and the auxiliary discharge transistor 102 are both N-type transistors. The delay circuit 104 includes a first inverter 1041 and a second inverter 1042. The first inverter 1041 is provided with an input end and an output end and the second inverter 1042 is provided with an input end and an output end. The output end of the first inverter 1041 is connected or coupled to the input end of the second inverter 1042. The input end of the first inverter 1041 is the input end of the delay circuit 104 and the output end of the second inverter 1042 is the output end of the delay circuit 104. Structures of the monitoring unit 103 and the first inverter 1041 are same as those in the embodiment shown in FIG. 6 and will not be repeated herein.

The second inverter 1042 includes a third driving transistor P2 and a fourth driving transistor N2. The third driving transistor P2 is a P-type transistor and the fourth driving transistor N2 is an N-type transistor. A source of the third driving transistor P2 is connected or coupled to the first section 2031 of the power supply metal line and a source of the fourth driving transistor N2 is connected or coupled to the grounding end 202. A drain of the third driving transistor P2 is connected or coupled to a drain of the fourth driving transistor N2 and is the output end of the second inverter 1042. A gate of the third driving transistor P2 is connected or coupled to a gate of the fourth driving transistor N2 and is the input end of the second inverter 1042.

A gate of the main discharge transistor 101 is connected or coupled to the second end of the monitoring capacitor C1, the gate of the first driving transistor P1 and the gate of the second driving transistor N1 are connected or coupled to the second end of the monitoring capacitor C1, the drain of the first driving transistor P1 and the drain of the second driving transistor N1 are connected or coupled to the gate of the third driving transistor P2, and the drain of the third driving transistor P2 and the drain of the fourth driving transistor N2 are connected or coupled to the gate of the auxiliary discharge transistor N02.

In an embodiment, the auxiliary discharge transistor 102, the N-type transistor of the first inverter 1041, and the N-type transistor of the second inverter 1042 are all located in a same P-type well on a substrate. That is, the auxiliary discharge transistor 102, the second driving transistor N1, and the fourth driving transistor N2 are arranged in the same P-type well on the substrate. In this way, a layout of the electrostatic discharge protection circuit can be optimized to reduce an area of the layout. The auxiliary discharge transistor 102 is configured to assist in discharging electrostatic charges accumulated on the power supply end 201 and a size of the auxiliary discharge transistor 102 may be smaller than a size of the main discharge transistor 101.

In an embodiment, the main discharge transistor 101 and the auxiliary discharge transistor 102 are located in different P-type wells on the substrate. The main discharge transistor 101 discharges a large portion of electrostatic charges, while the auxiliary discharge transistor 102 discharges a small portion of the electrostatic charges. As such, discharge capacity of the main discharge transistor 101 is higher than discharge capacity of the auxiliary discharge transistor 102. The main discharge transistor 101 and the auxiliary discharge transistor 102 are arranged separately to avoid mutual influence between the main discharge transistor 101 and the auxiliary discharge transistor 102, thereby ensuring discharge performance of the main discharge transistor 101 and the auxiliary discharge transistor 102.

In another embodiment, the main discharge transistor 101 and the auxiliary discharge transistor 102 are located in a same P-type well on the substrate, so as to arrange the layout of the integrated circuit and reduce the area of the layout.

In an embodiment, a size of the main discharge transistor 101 and a size of the auxiliary discharge transistor 102 may be continuously optimized, so that the main discharge transistor 101 can be conductive to discharge most of electrostatic charges, and the auxiliary discharge transistor 102 can remain conductive after the main discharge transistor 101 is turned off to continue to discharge remaining electrostatic charges. For example, the size of the main discharge transistor 101 and the size of the auxiliary discharge transistor 102 can be set to 10:1, 5:1, or 2:1.

Working principle of the electrostatic discharge protection circuit of FIG. 7 is described below with reference to FIG. 7:

when an electrostatic pulse is detected, for example, when voltage of the power supply end 201 rises from 0 V to 1 V in 1 ns, an impedance of the monitoring capacitor C1 drops due to high frequency of the electrostatic pulse. Voltage at node D1 is approximately at VCC causing the main discharge transistor 101 to become conductive. Electrostatic charges accumulated on the power supply end 201 are discharged to the grounding end 202 through the first section 2031 of the power supply metal line and the main discharge transistor 101.

The second driving transistor N1 also becomes conductive. After the second driving transistor N1 become conductive, voltage at node D0 is pulled down to GND and the third driving transistor P2 becomes conductive. Voltage at node D2 is pulled up to VCC causing the auxiliary discharge transistor 102 to become conductive after a delay of conduction time of the second driving transistor N1 and the third driving transistor P2. The electrostatic charges are further discharged to the grounding end 202 through the first section 2031 of the power supply metal line and the auxiliary discharge transistor 102.

When the electrostatic pulse arrives, impedance discontinuity at the first section 2031 and the second section 2032 of the power supply metal line may further reflect part of the electrostatic pulse, thereby reducing peak current of the electrostatic pulse transmitted to the internal circuit 300 through the power supply metal line.

When voltage of the power supply end 201 continues to rise, for example, when voltage of the power supply 201 continues to rise from 1 V to 2 V, conduction capabilities or discharge speeds of the main discharge transistor 101 and the auxiliary discharge transistor 102 may become larger and larger, until the conduction capabilities or discharge speeds of the main discharge transistor 101 and the auxiliary discharge transistor 102 and an amount of reflection by the impedance discontinuity are equal to an accumulation speed of electrostatic charges and voltage of the power supply end 201 no longer continues to rise. For example, voltage of the power supply end 201 no longer rises after rising up to 2 V.

When voltage of the power supply end 201 rises slowly, or when voltage of the power supply end 201 no longer continues to rise, or when voltage of the power supply 201 starts to drop, at this time, an equivalent impedance of the monitoring resistor R1 (usually tens of kilohms) and the monitoring capacitor C1 rises. Charges (e.g., voltage) at the gate of the main discharge transistor 101 discharge through the monitoring resistor R1 and voltage at node D1 decreases to GND causing the main discharge transistor 101 to turn off. However, at this time, electrostatic charges accumulated at the power supply end 201 have not been completely discharged (e.g., bled off). After voltage at node D1 drops from VCC to GND, voltage at node D2 may not immediately be pulled down from VCC to GND, but may be pulled down to GND after being delayed by conduction time of the first driving transistor P1 and the fourth driving transistor N2. In this way, the auxiliary discharge transistor 102 may continue to discharge remaining electrostatic charges until voltage at node D2 is pulled down to GND, at which point, the auxiliary discharge transistor 102 is turned off. In addition, after the main discharge transistor is turned off, the impedance discontinuity of the first section 2031 and the second section 2032 of the power supply metal line can still reflect part of the electrostatic pulse.

In the above-mentioned technical solution, when the electrostatic pulse is detected, the main discharge transistor 101 becomes conductive first and the auxiliary discharge transistor 102 becomes conductive subsequently. In this way, the main discharge transistor 101 discharges the electrostatic charges in time. The impedance discontinuity may further reflect part of the electrostatic pulse, so voltage at the power supply end 201 does not rise excessively fast due to accumulation of the electrostatic charges at the power supply end, thereby protecting the internal circuit 300. After a period of time, the main discharge transistor 101 is turned off while the auxiliary discharge transistor 102 remains conductive due to a delay action of the driving transistors and continues to discharge remaining electrostatic charges, thereby prolonging discharge time of the electrostatic discharge protection circuit.

Figure 8:
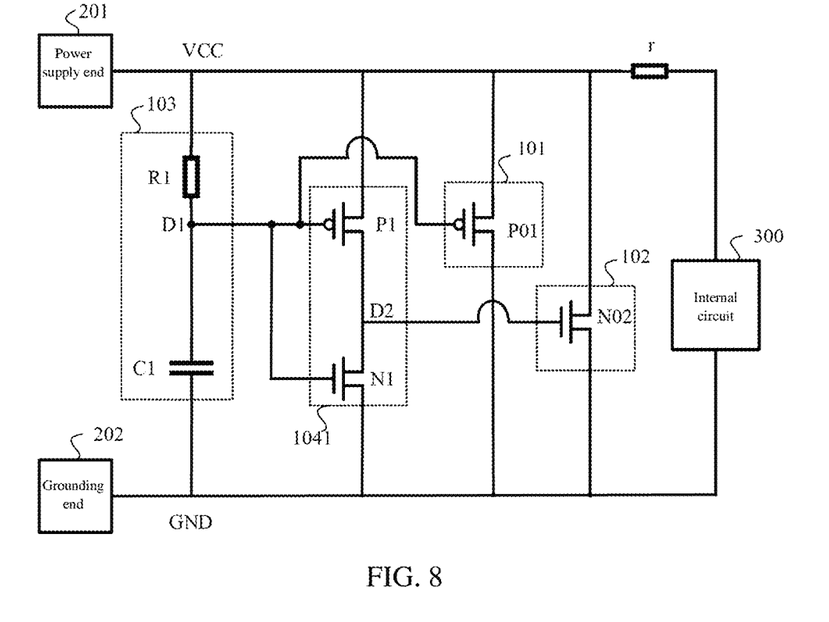
FIG. 8 illustrates a circuit diagram of an electrostatic discharge protection circuit of an internal circuit, according to an embodiment of this application.

FIG. 8 illustrates a circuit diagram of an electrostatic discharge protection circuit of an internal circuit 300, according to an embodiment of this application. The schematic shown in FIG. 8 is similar to the schematic shown in FIG. 6. As shown in FIG. 8, the main discharge transistor 101 is a P-type transistor, the auxiliary discharge transistor 102 is also an N-type transistor, and the monitoring unit 103 includes a monitoring resistor R1 and a monitoring capacitor C1 arranged in series. The first end of the monitoring resistor R1 is connected or coupled to the first section 2031 of the power supply metal line, and the second end of the monitoring capacitor C1 is connected or coupled to the grounding end 202. The first end of the monitoring capacitor C1 is connected or coupled to the second end of the monitoring resistor R1 and used as the output end of the monitoring unit 103. Structure of the delay circuit 104 has been described in FIG. 6 and will not be repeated herein.

Working principle of the electrostatic discharge protection circuit of FIG. 8 is described below with reference to FIG. 8:

When an electrostatic pulse is detected, for example, when voltage of the power supply end 201 rises from 0 V to 1 V in 1 ns, an impedance of the monitoring capacitor C1 drops when the electrostatic pulse is detected (e.g., a high-frequency signal) and voltage at node D1 is approximately at GND. At this time, the main discharge transistor 101 becomes conductive. Electrostatic charges accumulated on the power supply end 201 are discharged to the grounding end 202 through the first section 2031 of the power supply metal line and the main discharge transistor 101.

The first driving transistor P1 also becomes conductive. After the first driving transistor P1 become conductive, voltage at node D0 is pulled up to VCC. After a delay of conduction time of the first driving transistor P1, the auxiliary discharge transistor 102 becomes conductive. The electrostatic charges are further discharged to the grounding end 202 through the first section 2031 of the power supply metal line and the auxiliary discharge transistor 102.

When the electrostatic pulse is detected, impedance discontinuity at the first section 2031 and the second section 2032 of the power supply metal line may further reflect part of the electrostatic pulse, thereby reducing strength of the electrostatic pulse transmitted to the internal circuit 300 through the power supply metal line.

When the electrostatic pulse continues to rise, for example, when voltage of the power supply end 201 continues to rise from 1 V to 2 V, conduction capabilities or discharge speeds of the main discharge transistor 101 and the auxiliary discharge transistor 102 may become larger and larger, until the conduction capabilities or discharge speeds of the main discharge transistor 101 and the auxiliary discharge transistor 102 and an amount of reflection by the impedance discontinuity to the electrostatic pulse are equal to an accumulation speed of the electrostatic charges, and voltage of the power supply end 201 no longer continues to rise. For example, voltage of the power supply end 201 no longer rises after rising up to 2 V.

When voltage of the power supply end 201 rises slowly, or when voltage of the power supply end 201 no longer continues to rise, or when voltage of the power supply end 201 starts to drop, at this time, an equivalent impedance of the monitoring resistor R1 (usually tens of kilohms) and the monitoring capacitor C1 rises. Voltage of the power supply end 201 charges the gate of the main discharge transistor 101 through the monitoring resistor R1, and voltage at node D1 is pulled up to VCC causing the main discharge transistor 101 to turn off. However, at this time, the electrostatic charges on the power supply end 201 have not been completely discharged (i.e., bled off). After voltage at node D1 is pulled up from GND to VCC, voltage at node D2 may not immediately be pulled down from VCC to GND, but may be pulled down to GND after being delayed by conduction time of the second driving transistor N1. The auxiliary discharge transistor 102 may continue to discharge remaining electrostatic charges, until voltage at node D2 is pulled down to GND, at which point, the auxiliary discharge transistor 102 is turned off.

Figure 9:
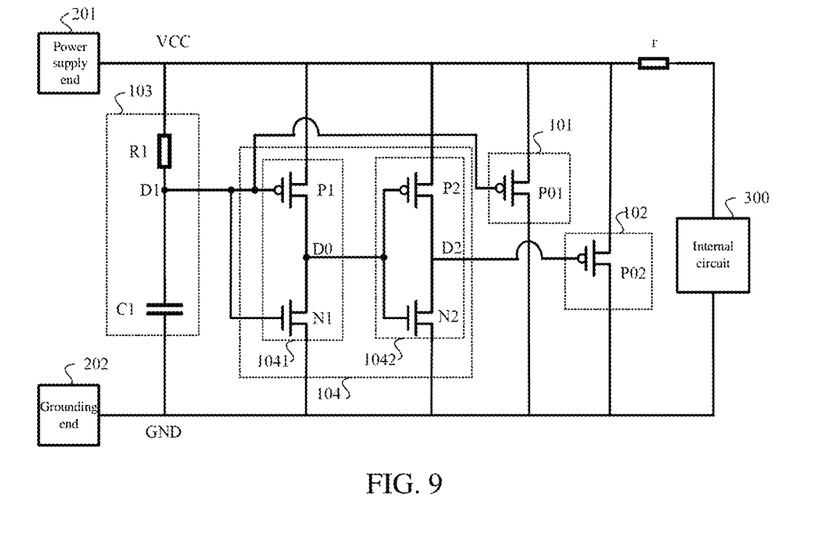
FIG. 9 illustrates a circuit diagram of an electrostatic discharge protection circuit of an internal circuit, according to an embodiment of this application.

FIG. 9 illustrates a circuit diagram of an electrostatic discharge protection circuit of an internal circuit 300, according to an embodiment of this application. The schematic shown in FIG. 9 is similar to the schematic shown in FIG. 7. As shown in FIG. 9, the main discharge transistor 101 is a P-type transistor, the auxiliary discharge transistor 102 is also a P-type transistor, and the monitoring unit 103 includes the monitoring resistor R1 and the monitoring capacitor C1 arranged in series. The first end of the monitoring resistor R1 is connected or coupled to the first section 2031 of the power supply metal line, and the second end of the monitoring capacitor C1 is connected or coupled to the grounding end 202. The first end of the monitoring capacitor C1 is connected or coupled to the second end of the monitoring resistor R1 and is the output end of the monitoring unit 103. Structure of the delay circuit 104 has been described in FIG. 7 and will not be repeated herein.

Working principle of the electrostatic discharge protection circuit of FIG. 9 is described below with reference to FIG. 9:

When an electrostatic pulse is detected, for example, when voltage of the power supply end 201 rises from 0 V to 1 V in 1 ns, an impedance of the monitoring capacitor C1 drops as the electrostatic pulse is detected, voltage at node D1 is approximately at GND causing the main discharge transistor 101 to become conductive. Electrostatic charges accumulated on the power supply end 201 are discharged to the grounding end 202 through the first section 2031 of the power supply metal line and the main discharge transistor 101.

The first driving transistor P1 also becomes conductive. After the first driving transistor P1 becomes conductive, voltage at node D0 is pulled up to VCC, and the fourth driving transistor N2 becomes conductive causing voltage at node D2 to be pulled down to GND. The auxiliary discharge transistor 102 becomes conductive after a delay of conduction time of the first driving transistor P1 and the fourth driving transistor N2. The electrostatic charges are further discharged to the grounding end 202 through the first section 2031 of the power supply metal line and the auxiliary discharge transistor 102.

When the electrostatic pulse is detected, impedance discontinuity at the first section 2031 and the second section 2032 of the power supply metal line may further reflect part of the electrostatic pulse, thereby reducing strength of the electrostatic pulse transmitted to the internal circuit 300 through the power supply metal line.

When the electrostatic pulse continues to rise, for example, when voltage of the power supply end 201 continues to rise from 1 V to 2 V, conduction capabilities or discharge speeds of the main discharge transistor 101 and the auxiliary discharge transistor 102 may become larger and larger, until the conduction capabilities or discharge speeds of the main discharge transistor 101 and the auxiliary discharge transistor 102 and an amount of reflection by impedance discontinuity to the electrostatic pulse are equal to an accumulation speed of the electrostatic charges, and voltage of the power supply end 201 no longer continues to rise. For example, voltage of the power supply end 201 no longer rises after rising up to 2 V.

When voltage of the power supply end 201 rises slowly, or when voltage of the power supply end 201 no longer continues to rise, or when voltage of the power supply end 201 starts to drop, at this time, an equivalent impedance of the monitoring resistor R1 (usually tens of kilohms) and the monitoring capacitor C1 rises. Voltage of the power supply end 201 charges the gate of the main discharge transistor 101 through the monitoring resistor R1, and voltage at node D1 is pulled up to VCC causing the main discharge transistor 101 to turn off. However, at this time, the electrostatic charges on the power supply end 201 have not been completely discharged (e.g., bled off). After voltage at node D1 is pulled up from GND to VCC, voltage at node D2 may not be immediately pulled up from GND to VCC, but may be pulled up to VCC after being delayed by conduction time of the second driving transistor N1 and the third driving transistor P2. As such, the auxiliary discharge transistor 102 may continue to discharge remaining electrostatic charges until voltage at node D2 is pulled up to VCC, at which point, the auxiliary discharge transistor 102 is turned off. After the main discharge transistor 101 is turned off, the impedance discontinuity of the first section 2031 and the second section 2032 of the power supply metal line can still reflect part of the electrostatic pulse.

Other embodiments of this application will readily occur to those skilled in the art after considering the specification and practicing the invention disclosed herein. This application is intended to cover any variations, uses, or adaptations of this application that follow the general principles of this application and include common sense or conventional techniques in the art that are not disclosed herein. The specification and embodiments are to be considered exemplary only and the true scope and spirit of this application are indicated by the following claims.

It should be understood that this application is not limited to the precise structure already described above and shown in the accompanying drawings and various modifications and changes may be made without departing from its scope. The scope of this application is limited only by the appended claims.

What is claimed is:

1. An electrostatic discharge protection circuit disposed between a power supply end and a grounding end of a semiconductor chip to protect an internal circuit of the semiconductor chip, the electrostatic discharge protection circuit comprising:
    a monitoring unit configured to detect an electrostatic pulse caused by electrostatic charges accumulated on the power supply end of the semiconductor chip;
    a main discharge transistor and an auxiliary discharge transistor configured to be conductive responsive to detection of the electrostatic pulse, wherein the main discharge transistor and the auxiliary discharge transistor discharge the electrostatic charges to the grounding end of the semiconductor chip, and wherein a conduction time of the main discharge transistor is prior to a conduction time of the auxiliary discharge transistor; and
    a power supply metal line coupling the power supply end to the internal circuit, wherein a first section of the power supply metal line is coupled to a first end of the main discharge transistor and a first end of the auxiliary discharge transistor, a third section of the power supply metal line is coupled to a first end of the internal circuit, and a second section of the power supply metal line couples the first section of the power supply metal line to the third section of the power supply metal line, and wherein the power supply metal line includes a first angle at a first contact position between the second section and the first section of the power supply metal line.

2. The electrostatic discharge protection circuit according to claim 1, wherein the first angle at the first contact position between the second section and the first section of the power supply metal line is a right angle or an acute angle.

3. The electrostatic discharge protection circuit according to claim 1, wherein the power supply metal line includes a second angle that is less than 180 degrees at a second contact position between the second section and the third section of the power supply metal line.

4. The electrostatic discharge protection circuit according to claim 1, wherein the power supply metal line is disposed at an uppermost metal layer of the semiconductor chip.

5. The electrostatic discharge protection circuit according to claim 1, wherein the monitoring unit comprises:
    a monitoring capacitor, wherein a first end of the monitoring capacitor is coupled to the first section of the power supply metal line; and
    a monitoring resistor, wherein a first end of the monitoring resistor is coupled to a second end of the monitoring capacitor and a second end of the monitoring resistor is coupled to the grounding end.

6. The electrostatic discharge protection circuit according to claim 5, further comprising:
    a delay circuit, wherein an input end of the delay circuit is coupled to a control end of the main discharge transistor and an output end of the delay circuit is coupled to a control end of the auxiliary discharge transistor.

7. The electrostatic discharge protection circuit according to claim 6, wherein the delay circuit comprises:

a first inverter, wherein an input end of the first inverter is the input end of the delay circuit and an output end of the first inverter is the output end of the delay circuit.

8. The electrostatic discharge protection circuit according to claim 6, wherein the main discharge transistor is an N-type transistor and the auxiliary discharge transistor is a P-type transistor.

9. The electrostatic discharge protection circuit according to claim 6, wherein the delay circuit comprises:
   a first inverter, wherein an input end of the first inverter is the input end of the delay circuit; and
   a second inverter, wherein an input end of the second inverter is coupled to an output end of the first inverter and an output end of the second inverter is the output end of the delay circuit.

10. The electrostatic discharge protection circuit according to claim 9, wherein the main discharge transistor is an N-type transistor and the auxiliary discharge transistor is an N-type transistor.

11. The electrostatic discharge protection circuit according to claim 9, wherein the auxiliary discharge transistor, an N-type transistor of the first inverter, and an N-type transistor of the second inverter are all located in a same P-type well on a substrate of the semiconductor chip; and
   the main discharge transistor and the auxiliary discharge transistor are located in different P-type wells on the substrate.

12. The electrostatic discharge protection circuit according to claim 9, wherein
   the main discharge transistor and the auxiliary discharge transistor are located in a same P-type well on a substrate of the semiconductor chip.

13. The electrostatic discharge protection circuit according to claim 1, wherein a size of the main discharge transistor is greater than a size of the auxiliary discharge transistor.

14. The electrostatic discharge protection circuit according to claim 1, wherein the monitoring unit comprises:
   a monitoring resistor, wherein a first end of the monitoring resistor is coupled to the first section of the power supply metal line; and
   a monitoring capacitor, wherein a first end of the monitoring capacitor is coupled to a second end of the monitoring resistor and a second end of the monitoring capacitor is coupled to the grounding end.

15. The electrostatic discharge protection circuit according to claim 14, wherein the main discharge transistor is a P-type transistor.

16. The electrostatic discharge protection circuit according to claim 1, wherein a disconnection time of the main discharge transistor is prior to a disconnection time of the auxiliary discharge transistor.

* * * * *